US006492731B1

United States Patent
Catabay et al.

(10) Patent No.: US 6,492,731 B1
(45) Date of Patent: Dec. 10, 2002

(54) COMPOSITE LOW DIELECTRIC CONSTANT FILM FOR INTEGRATED CIRCUIT STRUCTURE

(75) Inventors: Wilbur G. Catabay, Saratoga, CA (US); Wei-Jen Hsia, Sunnyvale, CA (US); Kai Zhang, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 37 days.

(21) Appl. No.: 09/605,380

(22) Filed: Jun. 27, 2000

(51) Int. Cl.[7] .......................... H01L 23/48; H01L 29/76

(52) U.S. Cl. ..................... 257/758; 257/760; 257/411

(58) Field of Search ................ 257/760, 758, 257/632, 640, 752, 773, 774, 411; 438/619, 672, 687, 671, 620, 761; 252/1; 106/287.13

(56) References Cited

U.S. PATENT DOCUMENTS

| 3,012,861 A | 12/1961 | Ling ........................... 23/223.5 |
| 3,178,392 A | 4/1965 | Kriner ......................... 260/46.5 |
| 3,652,331 A | 3/1972 | Yamazaki .................... 117/201 |
| 3,832,202 A | 8/1974 | Ritchie ........................ 106/287 |
| 3,920,865 A | 11/1975 | Läufer et al. ................. 427/220 |
| 4,705,725 A | 11/1987 | Glajch et al. ................. 428/405 |
| 5,194,333 A | 3/1993 | Ohnaka et al. .............. 428/405 |
| 5,314,845 A | 5/1994 | Lee et al. |
| 5,376,595 A | 12/1994 | Zupancic et al. ............. 501/12 |
| 5,558,718 A | 9/1996 | Leung ..................... 118/723 E |
| 5,559,367 A | 9/1996 | Cohen et al. .................. 257/77 |
| 5,578,524 A | * 11/1996 | Fukase et al. ............... 438/195 |
| 5,580,429 A | 12/1996 | Chan et al. ............. 204/192.38 |
| 5,628,871 A | 5/1997 | Shinagawa ................... 438/514 |

(List continued on next page.)

FOREIGN PATENT DOCUMENTS

| DE | 198 04 375 A1 | 7/1999 | ......... H01L/21/312 |
| EP | 0 706 216 A2 | 4/1996 | ......... H01L/23/532 |
| EP | 0 949 663 A2 | 10/1999 | ......... H01L/21/312 |
| JP | 63003437 | 1/1988 | ........... H01L/21/90 |
| JP | 2000-267128 | 9/2000 | ........... G02F/1/136 |
| WO | WO 99/41423 | 8/1999 | |

OTHER PUBLICATIONS

Sugahara, Satoshi, et al., "Chemical Vapor Deposition of $CF_3$–Incorporated Silica Films for Interlayer Dielectric Application", 1999 Joint International Meeting, *Electrochemical Society Meeting Abstracts*, vol. 99–2, 1999, Abstract No. 746.

Koda, Seiichiro, et al., "A Study of Inhibition Effects for Silane Combustion by Additive Gases", *Combustion and Flame*, vol. 73, No. 2, Aug., 1988, pp. 187–194.

(List continued on next page.)

*Primary Examiner*—Olik Chaudhuri
*Assistant Examiner*—(Vikki) Hoa B. Trinh
(74) *Attorney, Agent, or Firm*—John P. Taylor

(57) ABSTRACT

A composite layer of low k dielectric material for integrated circuit structures comprising a thick lower conformal barrier layer of low k dielectric material, a low k center layer of carbon-doped silicon oxide dielectric material having good gap filling capabilities, and a thick upper conformal barrier layer of low k dielectric material. The thick lower conformal barrier layer of low k dielectric material protects the lower surface of the main low k dielectric layer and also protects against misaligned vias entering the main low k dielectric material below the height of the metal line without raising the capacitance of the structure as would a lower barrier layer of non-low k dielectric material. The thick upper conformal barrier layer of low k dielectric material protects the upper surface of the main low k dielectric layer, as well as to provide thickness for vias to pass through without risk of via poisoning, and without raising the capacitance of the structure as would a thick upper barrier layer of non-low k dielectric material.

21 Claims, 2 Drawing Sheets

U.S. PATENT DOCUMENTS

| | | | |
|---|---|---|---|
| 5,675,187 A | 10/1997 | Numata et al. | 257/758 |
| 5,858,879 A | 1/1999 | Chao et al. | 438/725 |
| 5,874,367 A | 2/1999 | Dobson | 438/787 |
| 5,874,745 A | 2/1999 | Kuo | 257/59 |
| 5,882,489 A | 3/1999 | Bersin et al. | 204/192.35 |
| 5,883,014 A * | 3/1999 | Chen et al. | 438/637 |
| 5,904,154 A | 5/1999 | Chien et al. | 134/1.2 |
| 5,915,203 A | 6/1999 | Sengupta et al. | 438/669 |
| 5,930,655 A | 7/1999 | Cooney, III | |
| 5,989,998 A | 11/1999 | Sugahara et al. | |
| 6,028,015 A | 2/2000 | Wang et al. | 438/789 |
| 6,037,248 A | 3/2000 | Ahn | 438/619 |
| 6,043,145 A | 3/2000 | Suzuki et al. | |
| 6,043,167 A | 3/2000 | Lee et al. | 438/789 |
| 6,051,073 A | 4/2000 | Chu et al. | 118/723 |
| 6,054,379 A | 4/2000 | Yau | |
| 6,063,702 A | 5/2000 | Chung | |
| 6,114,259 A | 9/2000 | Sukharev et al. | 438/789 |
| 6,147,012 A | 11/2000 | Sukharev et al. | 438/787 |
| 6,153,524 A | 11/2000 | Henley et al. | 438/691 |
| 6,204,192 B1 | 3/2001 | Zhao et al. | 438/723 |
| 6,215,087 B1 | 4/2001 | Akahori et al. | |
| 6,232,658 B1 | 5/2001 | Catabay et al. | 257/701 |
| 6,284,644 B1 * | 9/2001 | Aug et al. | 438/623 |
| 6,303,047 B1 * | 10/2001 | Aronowitz et al. | 252/1 |

OTHER PUBLICATIONS

Koda, Seiichiro, et al., "A Study of Inhibition Effects for Silane Combustion by Additive Gases", *Combustion and Flame*, vol. 73, No. 2, Aug., 1988, pp. 187–194.

Peters, Laura, "Pursuing the Perfect Low–k Dielectric", *Semiconductor International*, vol. 21, No. 10, Sep., 1998, pp. 64–66, 68, 70, 72, and 74.

Wolf, S., et al., *Silicon Processing For the VLSI Era*, vol. 1: *Process Technology* (Sunset Beach, CA: Lattice Press, 1986), pp. 171–174.

Bothra, S., et al., "Integration of 0.25 $\mu$m Three and Five Level Interconnect System for High Performance ASIC", 1997 Proceedings Fourteenth International VMIC Conference, Santa Clara, CA, Jun. 10–12, 1997, pp. 43–48.

Dobson, C. D., et al., "Advanced $SiO_2$ Planarization Using Silane and $H_2O_2$", *Semiconductor International*, Dec. 1994, pp. 85–88.

McClatchie, S., et al., "Low Dielectric Constant Oxide Films Deposited Using CVD Techniques", 1998 Proceedings Fourth International DUMIC Conference, Feb. 16–17, 1998, pp. 311–318.

* cited by examiner

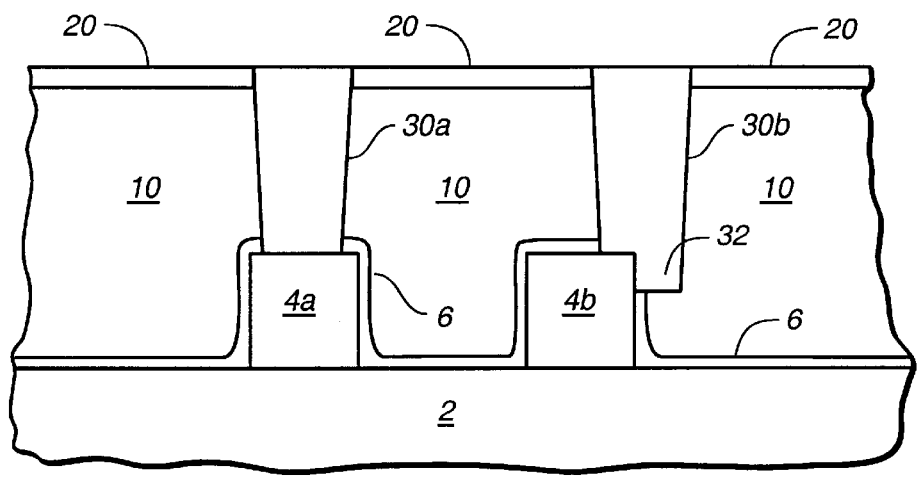
FIG._1 (PRIOR ART)
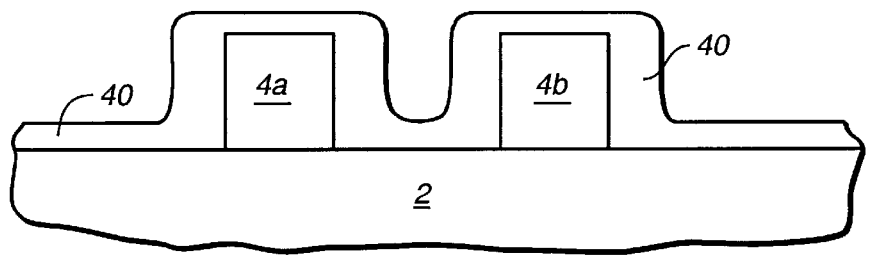
FIG._2
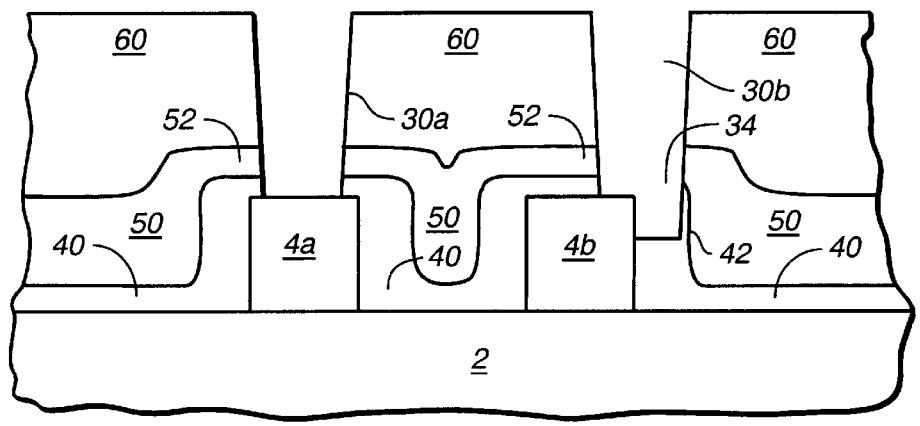
FIG._3

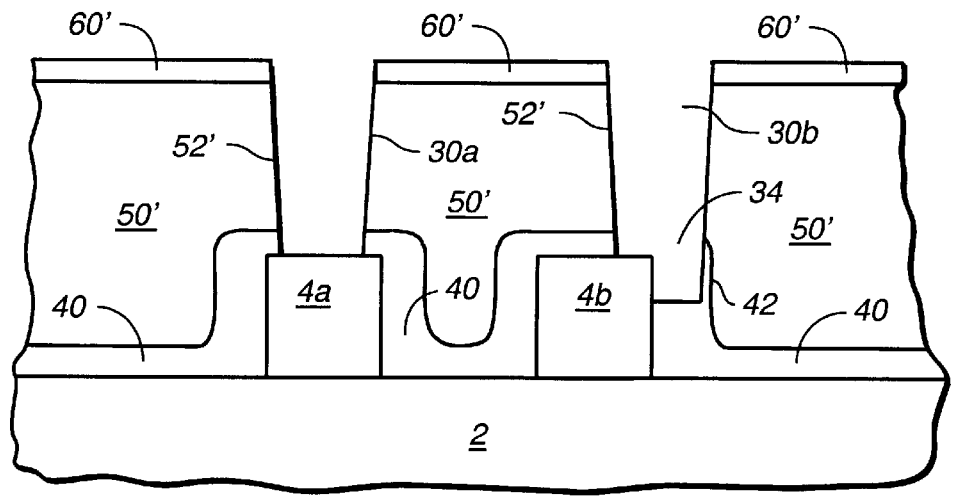
FIG._4
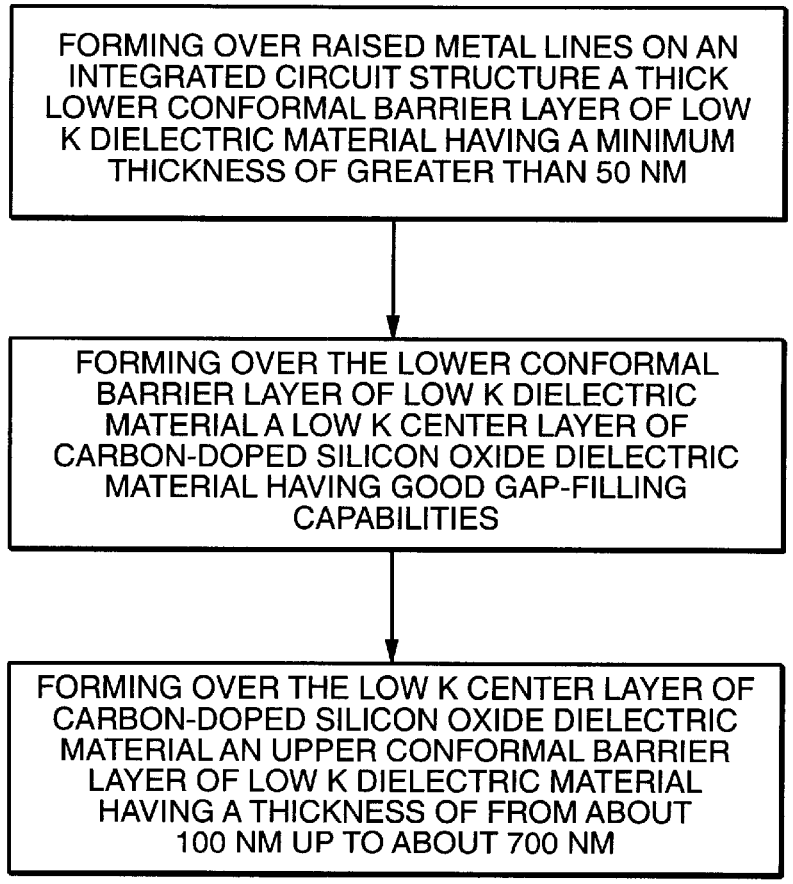
FIG._5

COMPOSITE LOW DIELECTRIC CONSTANT FILM FOR INTEGRATED CIRCUIT STRUCTURE

BACKGROUND OF THE INVENTION

1. Field of the Invention

This invention relates to the formation of low dielectric constant (low k) dielectric material for integrated circuit structures. More particularly, this invention relates to the formation of a composite layer of low dielectric material for integrated circuit structures comprising upper and lower conformal barrier layers of low k dielectric material with a low k center layer of carbon-doped dielectric material having good gap filling capabilities.

2. Description of the Related Art

In the continuing reduction of scale in integrated circuit structures, both the width of metal interconnects or lines and the horizontal spacing between such metal lines on any particular level of such interconnects have become smaller and smaller. As a result, horizontal capacitance has increased between such conductive elements. This increase in capacitance, together with the vertical capacitance which exists between metal lines on different layers, results in loss of speed and increased cross-talk. As a result, reduction of such capacitance, particularly horizontal capacitance, has received much attention. One proposed approach to solving this problem of high capacitance is to replace the conventional silicon oxide ($SiO_2$) dielectric material, having a dielectric constant (k) of about 4.0, with another dielectric material having a lower dielectric constant to thereby lower the capacitance.

In an article by L. Peters, entitled "Pursuing the Perfect Low-K Dielectric", published in Semiconductor International, Volume 21, No. 10, September 1998, at pages 64–74, a number of such alternate dielectric materials are disclosed and discussed. Included in these dielectric materials is a description of a low k dielectric material having a dielectric constant of about 3.0 formed using a chemical vapor deposition (CVD) process developed by Trikon Technologies of Newport, Gwent, U.K. The Trikon process is said to react methyl silane ($CH_3$—$SiH_3$) with hydrogen peroxide ($H_2O_2$) to form monosilicic acid which condenses on a cool wafer and is converted into an amorphous methyl-doped silicon oxide which i annealed at 400° C. to remove moisture. The article goes on to state that beyond methyl silane, studies show a possible k of 2.75 using dimethyl silane in the Trikon process. The Peters article further states that in high density plasma CVD (HDP-CVD), dielectric material formed from methyl silane or dimethyl silane and $O_2$ can provide a k as low as 2.75.

The use of this type of low k carbon-doped silicon oxide dielectric material has been found to have good gap filling characteristics, resulting in the formation of void-free filling of the high aspect ratio space between parallel closely spaced apart metal lines with dielectric material having a lower dielectric constant than that of convention silicon oxide, thereby resulting in a substantial lowering of the horizontal capacitance between such adjacent metal lines on the same metal wiring level.

However, the substitution of such low k carbon-doped silicon oxide dielectric materials for conventional silicon oxide insulation has not been without its own problems. Formation of the low k carbon doped silicon oxide dielectric material by the Trikon process is much slower than the conventional formation of undoped silicon oxide dielectric material. For example, in the time it takes to form a layer of low k carbon-doped silicon oxide dielectric material by the Trikon process on a single wafer, it may be possible to deposit a conventional silicon oxide dielectric layer of the same thickness on as many as 5 wafers.

However, even more importantly, it has been found that the subsequent formation of vias, or contact openings, through such low k carbon-doped silicon oxide dielectric material to the underlying conductive portions such as metal lines, or contacts on an active device, can contribute to a phenomena known as via poisoning wherein filler material subsequently deposited in the via, such as a titanium nitride liner and tungsten filler material, fails to adhere to the via surfaces.

For example, contact openings or vias are usually etched in the low k carbon-doped silicon oxide dielectric layer through a photoresist mask. When the photoresist mask used to form the vias is subsequently removed by an ashing process, damage can occur to the newly formed via surfaces of the low k carbon-doped silicon oxide dielectric material resulting in such via poisoning. Apparently the presence of carbon in the low k carbon-doped silicon oxide dielectric material formed by the Trikon process increases the porosity of the low k carbon-doped dielectric material, thus rendering the material more susceptible to damage during subsequent processing of the structure.

It has also been proposed to deposit low k silicon oxide dielectric material by other processes such as by plasma enhanced chemical vapor deposition (PECVD), using $CH_4$ and/or $C_4F_8$ and/or silicon tetrafluoride ($SiF_4$) with a mixture of silane, $O_2$, and argon gases. Plasma enhanced chemical vapor deposition (PECVD) is described more fully by Wolf and Tauber in "Silicon Processing for the VSLI Era", Volume 1-Process Technology (1986), at pages 171–174.

While the formation of a low k silicon oxide dielectric material by PECVD is much faster than the formation of the same thickness low k carbon-doped silicon oxide dielectric layer by the Trikon (i.e., at rates approaching the deposition rate of conventional silicon oxide), low k silicon oxide dielectric material deposited by PECVD has poor gap filling characteristics in high aspect ratio regions, resulting in the formation of voids in the dielectric materials deposited by PECVD in the spaces between the closely spaced apart metal lines in such structures.

Therefore, the formation of low k carbon-doped silicon oxide dielectric material is the preferred material for use as electrical insulation between horizontally spaced apart metal lines, and between layers of metal lines to provide low capacitance between such metal lines or other conductive portions of the integrated circuit structure. However, the previously discussed susceptibility of the low k silicon-doped silicon oxide dielectric material to subsequent damage, such as during the removal of photoresist masks after formation of a via pattern in the low k material, or reaction to oxide layers or metal lines beneath the low k dielectric materials, has resulted in the use of barrier layers of dielectric material formed above and below the low k layer of dielectric material to respectively protect the upper and low surfaces of the low k silicon doped silicon oxide dielectric material.

Such barrier layers, while successfully fulfilling their function of protecting the layer of low k carbon-doped silicon oxide dielectric material, are formed of conventional dielectric material such as conventional silicon oxide. The presence of such conventional high dielectric constant material, therefore, detracts from the goal of separating the metal lines from one another, both vertically and horizontally, by electrical insulation comprising low k dielectric material to reduce the capacitance between the metal lines.

To avoid the deleterious effects of using such barrier layers of high k dielectric material, the barrier layers have been formed as thin as possible, ranging in thickness from a minimum thickness of about 50 nanometers (nm) which is sufficient to provide the desired minimum barrier up to a maximum thickness of about 500 nm. The use of thicknesses greater than the minimum needed to protect the low k carbon-doped silicon oxide dielectric material during further processing or reaction with underlying oxide layers and metal lines can have an adverse effect on the overall capacitance of the structure, since the barrier layers are not formed of low k dielectric material.

While such use of very thin barrier layers of conventional (non-low k) dielectric material does protect the upper and low surf-aces of the layer of low k carbon-doped silicon oxide dielectric material while minimizing the contribution to high capacitance, another problem has arisen which the provision of a thin barrier layer does not address. In the prior art, the formation of very thin (narrow) metal lines, and the elimination of "dog bone" or enlarged contact regions on such lines for vias to intersect from another layer of metal lines can result in misalignment between the via opening and the underlying metal line, as shown in prior art FIG. 1.

Prior art FIG. 1 shows a fragment 2 of an integrated circuit structure having formed thereon raised metal lines 4a and 4b. Over metal lines 4a and 4b is formed a thin conformal barrier layer 6 of conventional (non-low k) dielectric material such as conventional silicon oxide having a thickness of 500 nm or less. A main dielectric layer 10 of low k carbon-doped silicon oxide dielectric material is then formed over barrier layer 6. Low k main dielectric layer 10 of low k carbon-doped silicon oxide dielectric material, as shown in FIG. 1, has good gap filling characteristics, resulting in a void free filling of the space between metal lines 4a and 4b. An upper barrier layer 20, which also comprises conventional (non-low k) dielectric material, such as conventional silicon oxide, is then formed over low k main dielectric layer 10 to protect the upper surface of low k carbon-doped silicon oxide main dielectric layer 10.

Still referring to FIG. 1, a via 30a is shown formed through dielectric layers 20, 10, and 6 from an upper metal line (not shown) down to raised metal line 4a, with via 30a shown formed in alignment with metal line 4a. However, such a via is not always etched through dielectric layers 20, 10, and 6 in perfect alignment with the underling metal line. Instead, what may happen, is the misalignment shown with respect to via 30b and underlying metal line 4b in FIG. 1. When this happens, the via etch, instead of stopping on the top surface of the metal line, extends down the sidewall of the metal line, as shown at 32. Furthermore, since barrier layer 6 on the sidewall of metal line 4a is formed very thin (to avoid excess capacitance through the non-low k barrier dielectric material), the misaligned etch not only etches away the portion of barrier layer 6 on the sidewall of metal line 4a, but also a portion of low k carbon-doped silicon oxide dielectric layer 10 as well. This, in turn, increases the overall exposed surface area of low k carbon-doped silicon oxide dielectric material of layer 10 to the etching materials used to form the via as well as increasing the surface of low k dielectric material which may be damaged during the subsequent ashing process used to remove the photoresist via mask.

Increasing the thickness of barrier layer 6 beneath main low k carbon-doped silicon oxide dielectric layer 10 would also increase the thickness of barrier layer 6 formed on the sidewall of the raised metal lines, thus inhibiting etching of the portion of the low k carbon-doped silicon oxide dielectric material of layer 10 shown etched away at 32 in FIG. 1. However, this has been avoided in the past because of the increase in capacitance which can occur when the volume of non-low k barrier dielectric material of layer 6 is increase at the expense of a decrease in the volume of low k carbon-doped silicon oxide dielectric material of layer 10 separating, for example, metal lines 4a and 4b from one another, as well as other separating them horizontally from other metal lines lying in the same plane, or other metal lines vertically spaced above or beneath metal lines 4a and 4b.

The formation and use of composite layers of low k dielectric material have been suggested by others. Copending U.S. patent application Ser. No. 09/426,061 entitled "LOW DIELECTRIC CONSTANT SILICON OXIDE-BASED DIELECTRIC LAYER FOR INTEGRATED CIRCUIT STRUCTURES HAVING IMPROVED COMPATIBILITY WITH VIA FILLER MATERIALS, AND METHOD OF MAKING SAME", was filed by two of us with others on Oct. 22, 1999, and is assigned to the same assignee as this application. The subject matter of U.S. patent application Ser. No. 09/426,061 is hereby incorporated by reference. In one embodiment in that application, low k silicon oxide dielectric material having a high carbon doping level is formed in the high aspect regions between closely spaced apart metal lines and then a second layer comprising a low k silicon oxide dielectric material having a lower carbon content is then deposited over the first layer and the metal lines.

Copending U.S. patent application Ser. No. 09/425,552 entitled "INTEGRATED CIRCUIT STRUCTURE HAVING LOW DIELECTRIC CONSTANT MATERIAL AND HAVING SILICON OXYNITRIDE CAPS OVER CLOSELY SPACED APART METAL LINES", was filed by two of us with another on Oct. 22, 1999, and is assigned to the same assignee as this application. The subject matter of U.S. patent application Ser. No. 09/425,552 is hereby incorporated by reference. In one embodiment in that application, low k silicon oxide dielectric material which exhibits void-free deposition properties in high aspect ratio regions between closely spaced apart metal lines is deposited over and between the metal lines and over silicon oxynitride caps on underlying metal lines. After the formation of such void-free low k silicon oxide dielectric material between the closely spaced apart metal lines and the silicon oxynitride caps thereon, the structure is planarized to bring the level of the low k silicon oxide dielectric material down to the level of the tops of the silicon oxynitride caps on the metal lines. A further layer of standard k silicon oxide dielectric material is then formed over the planarized void-free low k silicon oxide dielectric layer and the silicon oxynitride caps. Vias are then formed through the standard k silicon oxide dielectric layer and the silicon oxynitride caps down to the metal lines. Since the vias are not formed through the low k silicon oxide dielectric material, formation of the vias does not contribute to poisoning of the vias. However, the presence of the low k silicon oxide dielectric material between the horizontally closely spaced apart metal lines reduces the horizontal capacitance between such metal lines.

Copending U.S. patent application Ser. No. 09/426,056 entitled "LOW K DIELECTRIC COMPOSITE LAYER FOR INTEGRATED CIRCUIT STRUCTURE WHICH PROVIDES VOID-FREE LOW K DIELECTRIC MATERIAL BETWEEN METAL LINES WHILE MITIGATING VIA POISONING", was filed by one of us with another on Oct. 22, 1999, and is assigned to the same assignee as this application. The subject matter of U.S. patent application Ser. No. 09/426,056 is also hereby incorporated by reference. In one embodiment in that application, a void-free low k silicon oxide dielectric material is formed in the high aspect regions between closely spaced apart metal lines by one of several processes, including the process used to form the first low k silicon oxide dielectric material described in the previously cited U.S. patent application Ser. No. 09/426,061. A second layer of low k silicon oxide dielectric material is then deposited over the first layer and the metal lines by a process which deposits at a rate higher than the deposition rate of the void-free dielectric material. In a preferred embodiment, both of the layers are formed in the same vacuum chamber without an intervening planarization step.

SUMMARY OF THE INVENTION

The invention comprises a composite layer of low k dielectric material for integrated circuit structures comprising a thick lower conformal barrier layer of low k dielectric material, a low k center layer of carbon-doped silicon oxide dielectric material having good gap filling capabilities, and a thick upper conformal barrier layer of low k dielectric material.

BRIEF DESCRIPTION OF THE DRAWINGS

FIG. 1 is a fragmentary vertical cross-sectional view of a prior art structure.

FIG. 2 is a fragmentary vertical cross-sectional view showing the composite layer of low k dielectric material of the invention at an intermediate stage of formation with the thick lower conformal barrier layer of low k dielectric material formed over the metal lines.

FIG. 3 is a fragmentary vertical cross-sectional view of the structure of FIG. 2 showing the composite layer of low k dielectric material of the invention, including both the main dielectric layer of low k carbon-doped silicon oxide dielectric material and the thick upper conformal barrier layer of low k dielectric material.

FIG. 4 is a fragmentary vertical cross-sectional view of an alternate embodiment of the structure shown in FIG. 3 showing the composite layer of low k dielectric material of the invention, with a thinner upper conformal barrier layer of low k dielectric material formed over the main dielectric layer of low k carbon-doped silicon oxide dielectric material.

FIG. 5 is a flowsheet illustrating a method of making the composite layer of low k dielectric material of the invention.

DETAILED DESCRIPTION OF THE INVENTION

The invention comprises a composite layer of low dielectric material for integrated circuit structures comprising a thick lower conformal barrier layer of low k dielectric material, a low k center layer of carbon-doped silicon oxide dielectric material having good gap filling capabilities, and a thick upper conformal barrier layer of low k dielectric material.

The term "low k", as used herein, is intended to define a dielectric constant of a dielectric material of 3.5 or less. Preferably, the dielectric constant of a "low k" material will be 3.0 or less.

The term "thick", as used herein with respect to the respective thicknesses of the upper and lower conformal layers of low k dielectric material, is intended to define a thickness at least greater than 50 nm.

The term "good gap filling capabilities", as used herein, is intended to define a low k dielectric material capable of filling a gap between raised portions without forming any voids detectable with SEM cross-section.

Turning to FIGS. 2–4, the structure of the invention is illustrated. As in FIG. 1, a fragment 2 of an integrated circuit structure is shown having metal lines 4a and 4b formed thereon. Unlike FIG. 1, however, in accordance with the invention, a thick lower conformal barrier layer 40 of low k dielectric material is formed over metal lines 4a and 4b and the exposed portions of integrated circuit structure 2, as shown in FIG. 2. Lower conformal barrier layer 40 is formed of low k dielectric material deposited to a thickness at least greater than 50 nm. The maximum thickness of lower conformal barrier layer 40 will be determined to some extent by the horizontal spacing apart of adjacent metal lines since the manner of forming the low k conformal dielectric material (e.g., by PECVD) usually does not result in gap filling characteristics as satisfactory as the CVD process used to form the center layer of low k carbon-doped silicon oxide dielectric material, as will be described. For metal line horizontal spacing of 250 nm, the maximum thickness of the lower conformal barrier layer 40 of low k dielectric material usually should not exceed about 100 nm.

Thick lower conformal barrier layer 40 of low k dielectric material may be formed by a plasma enhanced chemical vapor deposition (PECVD), using a methyl-substituted silane (such as methylsilane, dimethylsilane, trimethylsilane, or tetramethylsilane) and an oxygen-containing gas (such as $O_2$, CO, $N_2O$, or mixtures of such oxygen-containing gases). In a typical PECVD process to form the lower conformal barrier layer of low k dielectric material with a dielectric constant of less than about 3.0, the reactor is maintained with a temperature range of from about 10° C. to about 400° C. and at a pressure range of from about 1,000 millitorr to about 4,000 millitorr, and a plasma is maintained within the reactor at a power level of from about 200 watts to about 1,000 watts during the deposition. Typical process gases are flowed into a 5 liter reactor at the rate of, in standard cubic centimeters/minute (sccm), 100 sccm to 500 sccm of a methyl-substituted silane such as $(CH_3)SiH_3$, and 100 sccm to 500 sccm of an oxygen-containing gas such as $O_2$. Such flow rates may be suitably adjusted for other size reactors.

As mentioned earlier, plasma enhanced chemical vapor deposition (PECVD) is described more fully by Wolf and Tauber in "Silicon Processing for the VSLI Era", Volume 1-Process Technology (1986), at pages 171–174.

After forming lower conformal barrier layer 40 of low k dielectric material over metal lines 4a and 4b to a thickness of at least greater than 50 nm, the main layer 50 of low k carbon-doped silicon oxide dielectric material is formed over low k lower barrier layer 40, as shown in FIG. 3. A thick upper conformal barrier layer 60 of low k dielectric material is then formed over main low k dielectric layer 50.

Main layer 50 of low k carbon-doped silicon oxide dielectric material may comprise the reaction product of methyl silane ($CH_3SiH_3$) and hydrogen peroxide ($H_2O_2$), as described in the previously cited Peters article, or it may comprise the reaction product of a mild oxidant such as hydrogen peroxide wit the carbon-substituted silane materials disclosed in Aronowitz et al. U.S. Pat. No. 6,303,047, issued Oct. 16, 2001, and assigned to the assignee of this application, the subject matter of which is hereby incorporated by reference.

Any other forms of non-PECVD low k carbon-doped silicon oxide dielectric material may also be used in the formation of main low k dielectric layer 50 provided that they have a dielectric constant below 3.0 and also exhibit good gap filling capabilities.

Upper conformal barrier layer 60 of low k dielectric material may comprise the same low k dielectric material used in the formation of lower barrier layer 40. However, as will be discussed below, the thickness of upper conformal barrier layer 60 may have a broader range than lower conformal barrier layer 40.

Still referring to FIG. 3, after formation of main low k dielectric layer 50 of carbon-doped silicon oxide dielectric material over lower conformal barrier layer 40, and the subsequent formation of upper conformal barrier layer 60 of low k dielectric material over main low k dielectric layer 50, vias 30a and 30b may be etched through low k dielectric layers 40, 50, and 60 down to metal lines 4a and 4b. As in the prior art structure illustrated in FIG. 1, via 30b is shown misaligned with respect to metal line 4b. However, in accordance with the invention, the extended thickness of lower conformal barrier layer 40, which is made possible by the use of a conformal barrier layer of low k dielectric material of thicker dimensions than the conventional thin barrier layers of non-low k dielectric material, causes the misaligned sidewall of via 30b to not extend horizontally into main low k dielectric layer 50 of carbon-doped silicon oxide dielectric material. That is the sidewall of portion 34 of via 30b will comprise the surface of portion 42 of thick lower conformal low k barrier layer 40, not a surface of main low k dielectric layer 50. Since the low k dielectric material comprising lower conformal low k barrier layer 40 is not as sensitive to chemical attack by either the via etchants or the process subsequently used to remove the via photoresist mask as would be the low k carbon-doped silicon oxide dielectric material comprising main dielectric layer 50, via poisoning is thereby mitigated.

It will also be noted in FIG. 3 that the portion 52 of main low k dielectric layer 50 of carbon-doped silicon oxide dielectric material which is above metal lines 4a and 4b is thinner than the remainder of layer 50 due to the planar (non-conformal) nature of the deposition. In the preferred embodiment shown in FIG. 3, this portion 52 of main low k dielectric layer 50 is formed of a thickness ranging from about 10 nm to about 100 nm to further mitigate via "poisoning", since this is the portion of layer 50 through which vias 30a and 30b will be formed. The remainder of the total thickness of the composite layer of low k dielectric material, i.e., the desired total thickness of the low k dielectric material from the top of metal lines 4a and 4b up to the next level of metal lines, is then provided for by the total thickness of lower conformal barrier layer 40 and upper conformal barrier layer 60. Thus, for example, if the total desired vertical spacing between the tops of metal lines 4a and 4b and the bottom surface of the next level of metal lines is about 500 nm (5 kiloAngstroms), and the thickness of lower conformal barrier layer 40 is, for example, 55 nm, a thickness of main low k dielectric layer 50 of about 50–100 nm will require a thickness of upper conformal barrier layer 60 to be from at least about 350 nm to about 400 nm. For the embodiment shown in FIG. 3, wherein the dielectric constant k of upper conformal barrier layer 60 is less than 3.0, the total thickness of upper conformal barrier layer 60 may range from as little as about 100 nm to a maximum of about 700 nm. Typically the thickness of upper conformal barrier layer 60 (for this embodiment) will range from about 300 nm to about 600 nm.

It should be noted in this regard, that the maximum thickness of lower conformal barrier layer 40 (for any fixed total thickness between layers of metal lines) will be influenced by the horizontal spacing between metal lines 4a and 4b, since the conformal nature of the deposition of layer 40 does not exhibit good gap filling characteristics, thus necessitating that the maximum thickness of layer 40 be limited to provide sufficient total thickness of main low k dielectric layer 50 to permit formation of portions of layer 50 between the sidewalls coating of layer 40 on the sidewalls of the metal lines, since the low k dielectric material comprising layer 50 does possess good gap filling characteristics.

It must also be noted that the minimum thickness of main low k dielectric layer 50 will be influenced by the amount of layer 50 low k carbon-doped silicon oxide dielectric material which must be formed to completely fill the gap between metal lines 4a and 4b. However, within these restraints or guidelines, the minimization of the thickness of main low k dielectric layer 50 at 52 and the maximizing of the thickness of upper conformal barrier layer 60 over main low k dielectric layer 50 at this point to meet the required total vertical spacing between layers of metal lines will minimize the amount of via "poisoning" experienced. In addition, since the PECVD formation of upper conformal barrier 60 proceeds at a faster deposition rate than the formation of main low k dielectric layer 50 by reaction between a peroxide and a carbon-substituted silane, the total time period necessary for the formation of the composite low k dielectric layer will be shortened.

However, it should be noted that there will be times that it is more desirous to maximize the thickness of main low k dielectric layer 50 over metal lines 4a and 4b and to minimize the thickness of upper conformal barrier layer 60. This construction is shown in FIG. 4 wherein the thickness of main low k dielectric layer 50' at 52' over metal lines 4a and 4b is much greater that the spacing at 52 in FIG. 3, and the corresponding thickness of upper conformal barrier layer 60' is correspondingly reduced from the thickness of upper conformal barrier layer 60 in FIG. 3. Such a structure may be utilized instead of the structure shown in FIG. 3, for example, where the dielectric constant (k value) of main low k layer 50' is much lower that the dielectric constant of upper conformal barrier layer 60'. That is, for example, when the dielectric constant k of main low k dielectric layer 50' is less than 3.0 and the dielectric constant k of upper conformal barrier layer 60' is greater than 3.5, and other means are utilized to eliminate or compensate for the extended via sidewall surface passing through main low k dielectric layer 50' and the attendant risk of via poisoning.

Thus, the invention provides a composite layer of low k dielectric material wherein 1) a thick lower conformal barrier layer of low k dielectric material protects the lower surface of the main layer of low k carbon-doped silicon oxide dielectric material and also protects against misaligned vias entering the main layer of low k carbon-doped silicon oxide dielectric material below the height of the metal line without raising the capacitance of the structure as would a lower barrier layer of non-low k dielectric material; 2) a main layer of low k carbon-doped silicon oxide dielectric material having good gap filling capabilities; and 3) a thick upper conformal barrier layer of low k dielectric material protects the upper surface of the main low k dielectric layer, as well as to provide thickness for vias to pass through without risk of via poisoning, and without raising the capacitance of the structure as would a thick upper barrier layer of non-low k dielectric material.

Having thus described the invention what is claimed is:

1. A composite layer of low k dielectric material for integrated circuit structures comprising a thick lower conformal barrier layer of low k dielectric material, a low k center layer of carbon-doped silicon oxide dielectric material having good gap filling capabilities, and a thick upper conformal barrier layer of low k dielectric material.

2. The composite layer of low k dielectric material of claim 1 wherein said thick lower conformal barrier layer of low k dielectric material comprises a PECVD low k dielectric material and said thick upper conformal barrier layer of low k dielectric material also comprises a PECVD low k dielectric material.

3. The composite layer of low k dielectric material of claim 2 wherein said low k center layer of carbon-doped silicon oxide dielectric material is formed by reacting a carbon-substituted silane with a peroxide to form a low k carbon-doped silicon oxide dielectric material having good gap filling capabilities.

4. The composite layer of low k dielectric material of claim 2 wherein said low k center layer of carbon-doped silicon oxide dielectric material is formed by reacting methylsilane with hydrogen peroxide to form a low k carbon-doped silicon oxide dielectric material having good gap filling capabilities.

5. The composite layer of low k dielectric material of claim 2 wherein said low k center layer of carbon-doped silicon oxide dielectric material is formed by reacting with hydrogen peroxide a carbon-substituted silane having only primary hydrogens bonded to the carbon atoms and having the formula: $SiH_x((C)_y(CH_3)_z)_{(4-x)}$, where x ranges from 1 to 3, y is an integer from 1 to 4, and z is 2y+1 to form a low k carbon-doped silicon oxide dielectric material having good gap filling capabilities.

6. The composite layer of low k dielectric material of claim 2 wherein said thick lower conformal barrier layer of PECVD low k dielectric material is a PECVD low k silicon oxide dielectric material.

7. The composite layer of low k dielectric material of claim 2 wherein said thick lower conformal barrier layer of PECVD low k dielectric material is a PECVD low k silicon oxide dielectric material having a dielectric constant k of less than 3.0.

8. The composite layer of low k dielectric material of claim 2 wherein said conformal barrier layer of PECVD low k dielectric material is a low k silicon oxide dielectric material formed using a methyl-containing silane and an oxygen-containing precursor.

9. The composite layer of low k dielectric material of claim 2 wherein said thick lower conformal barrier layer of PECVD low k dielectric material has a thickness greater than 50 nm.

10. The composite layer of low k dielectric material of claim 2 wherein said thick upper conformal barrier layer of PECVD low k dielectric material is a low k silicon oxide dielectric material.

11. The composite layer of low k dielectric material of claim 2 wherein said thick upper conformal barrier layer of PECVD low k dielectric material is a low k silicon oxide dielectric material formed using a methyl-containing silane and an oxygen-containing precursor.

12. The composite layer of low k dielectric material of claim 2 wherein said thick upper conformal barrier layer of PECVD low k dielectric material has a thickness greater than 50 nm.

13. The composite layer of low k dielectric material of claim 2 wherein said thick upper conformal barrier layer of PECVD low k dielectric material has a dielectric constant k of less than 3.0, and a thickness of from about 100 nm to about 700 nm.

14. The composite layer of low k dielectric material of claim 2 wherein said thick upper conformal barrier layer of PECVD low k dielectric material has a dielectric constant k of less than 3.0, and a thickness of from about 300 nm to about 600 nm.

15. A composite layer of low k dielectric material for integrated circuit structures comprising:

a) a thick lower conformal barrier layer of low k dielectric material having a minimum thickness of greater than 50 nm;

b) a low k center layer of carbon-doped silicon oxide dielectric material formed by reacting a carbon-substituted silane with hydrogen peroxide to form a low k carbon-doped silicon oxide dielectric material having good gap filling capabilities; and c) a thick upper conformal barrier layer of low k dielectric material having a thickness ranging from about 100 nm to about 700 nm.

16. The composite layer of low k dielectric material of claim 15 wherein said thick lower conformal barrier layer of low k dielectric material is a low k silicon oxide dielectric material formed by PECVD.

17. The composite layer of low k dielectric material of claim 15 wherein said low k center layer of carbon-doped silicon oxide dielectric material is formed by reacting methylsilane with hydrogen peroxide to form a low k carbon-doped silicon oxide dielectric material having good gap filling capabilities.

18. The composite layer of low k dielectric material of claim 15 wherein said low k center layer of carbon-doped silicon oxide dielectric material is formed by reacting with hydrogen peroxide a carbon-substituted silane having only primary hydrogens bonded to the carbon atoms and having the formula: $SiH_x((C)_y(CH_3)_z)_{(4-x)}$, Where x ranges from 1 to 3, y is an integer from 1 to 4, and z is 2y +1 to form a low k carbon-doped silicon oxide dielectric material having good gap filling capabilities.

19. The composite layer of low k dielectric material of claim 15 wherein said thick upper conformal barrier layer of low k dielectric material is a low k silicon oxide dielectric material formed by PECVD.

20. The composite layer of low k dielectric material of claim 15 wherein said thick upper conformal barrier layer of low k dielectric material has a dielectric constant k of less than 3.0, and a thickness of from about 300 nm to about 600 nm.

21. A composite layer of low k dielectric material for integrated circuit structures comprising:

a) a thick lower conformal barrier layer of low k silicon oxide dielectric material formed by PECVD, having a dielectric constant k of less than 3.0, and a minimum thickness of greater than 50 nm;

b) a low k center layer of carbon-doped silicon oxide dielectric material formed by reacting a carbon-substituted silane with hydrogen peroxide to form a low k carbon-doped silicon oxide dielectric material having good gap filling capabilities; and c) a thick upper conformal barrier layer of low k dielectric material formed by PECVD, having a dielectric constant k of less than 3.0, and a thickness of from about 100 nm to about 600 nm.

* * * * *